United States Patent [19]

Morel

[11] Patent Number: 4,972,357

[45] Date of Patent: Nov. 20, 1990

[54] DIGITAL FILTER WITH INTEGRATED DECIMATION

[75] Inventor: Patrick Morel, Eragny sur Oise, France

[73] Assignee: Alcatel N.V., Stuttgart, Fed. Rep. of Germany

[21] Appl. No.: 314,900

[22] Filed: Feb. 24, 1989

[30] Foreign Application Priority Data

Feb. 24, 1988 [FR] France .................. 88 02235

[51] Int. Cl.$^5$ .................................. G06F 15/31
[52] U.S. Cl. ........................................ 364/724.10
[58] Field of Search ............ 364/724.10, 724.20, 364/724.01, 724.19

[56] References Cited

U.S. PATENT DOCUMENTS 4,472,785  9/1984  Kasuga ................... 364/724.10
4,766,562  8/1988  Vary ....................... 364/724.10

OTHER PUBLICATIONS

Adams et al; "A New Approach to FIR Digital Filters with Fewer Multipliers and Reduced Sensitivity"; *IEEE Trans Circuits & Systems* v. CAS-30 (May '83), pp. 277–283.
"On Party Digital Anti-Aliasing Filters", H. W. Schussler et al, 1982.
"Design of Linear-Phase Partly Digital Anti-Aliasing Filters", T. Saramaki et al, 1985, IEEE.
"On Multistage Finite Impulse Response (FIR) Filters With Decimation", R. Shively, IEEE, vol. ASSP-23, No. 4, Aug. 1975.
"A Class Of Linear-Phase FIR Filters For Decimation, Interpolation, and Narrow-Band Filtering", 8084 IEEE, ASSP-32, 1984, Oct., No. 5, New York.

*Primary Examiner*—Dale M. Shaw
*Assistant Examiner*—Long T. Nguyen
*Attorney, Agent, or Firm*—Christie, Parker & Hale

[57] ABSTRACT

A digital filter with integrated decimation shapes a sampled signal and reduces its sampling rate. The filter includes, in cascade, a prefilter (5), a decimator stage (8) and an equalizer (9). The prefilter is a simplified FIR filter in which only logical operations are performed; all multi-digit multiplications are performed only in the equalizer, at the reduced sampling rate. This results in a filter having increased throughput and/or occupying a reduced area.

1 Claim, 1 Drawing Sheet

DIGITAL FILTER WITH INTEGRATED DECIMATION

The present invention relates to digital filters, and more particularly to digital filters which process a signal which is over-sampled for the purpose of shaping said signal, and which perform decimation in order to provide a signal at a reduced sampling rate.

BACKGROUND OF THE INVENTION

The invention is particularly applicable to transmitting data by radio in a form which may be considered as being analog whereas on reception the transmitted signal, transposed back to base band, must be processed digitally. The conversion of the transmitted analog signal into digital form then takes place by sampling and coding at a rate which is much higher than the Shannon rate required for the bandwidth of the signal being encoded. Such over-sampling makes it possible to use analog low-pass filters which are cheaper and simpler in design and which are required, in any case prior to analog-to-digital conversion. Nyquist filtering of the transmission channel may also be performed on an over-sampled signal, prior to decimation.

Decimation is an operation which consists in retaining only one sample out of R samples in a sequence of high rate samples of a digital input signal. R is the decimation ratio. Analysis shows that if R is too high relative to the spectrum of the input signal, then decimation gives rise to spectrum folding which ought to be avoided. To do this, it is common practice to shape the input signal prior to decimation. Shaping is done by low-pass type filtering which does not affect the signal to be retained after decimation.

The usual way of accomplishing such filtering on a digital signal is to use a finite impulse response (FIR) filter, in which each output sample is the sum of N prior samples of the input signal as weighted by appropriate coefficients. Such a filter performs N parallel multiplications whose results are delayed and summed. Multiplication is the more complex operation and the time required for the multiplication limits the maximum throughput of the filter. A filter implemented in a given technology thus has a limited field of application.

However, it is also known that an FIR filter may be replaced by a series combination of a prefilter and an equalizer. This is explained in the article "A new approach to FIR digital filters with fewer multipliers and reduced sensitivity" by J. W. Adams and A. N. Willson, published in IEEE Transactions on Circuits and Systems, Vol. CAS-30, pp. 277-283, May 1983. The prefilter is a simplified FIR filter comprising a small number of very simple coefficients (0, -1, 1, ...) so that it does not need to perform multiplications.

The maximum possible throughput of such a filter is limited solely by addition operations. This throughput is considerably higher than that of a conventional FIR filter. The equalizer is also an FIR filter and its function is to correct the transfer function of the prefilter and to ensure that the overall transfer function (prefilter plus equalizer) is as required. Since the equalizer provides only one correction, it is of relatively low order and therefore performs only a relatively small number of multiplications. When equipment is implemented in the form of very large scale integration (VLSI), this reduces the area occupied by the filter. The limitation on the maximum sampling rate acceptable by the filter is the same as for a conventional FIR filter.

As mentioned at the beginning of the present text, the invention relates particularly, but not exclusively, to cases where an oversampled signal is also to be filtered for transmission purposes (Nyquist filter). This filtering operation must necessarily be performed prior to decimation. It may, naturally, be combined with that described above which is specific to decimation. This gives rise to different coefficients and generally emphasizes problems relating to the limited maximum sampling rate in both modes of filtering mentioned above.

The present invention seeks to provide a solution to these problems in the form of an integrated decimation filter in which there are no portions that perform multiplication at the high rate at which the input signal is sampled.

SUMMARY OF THE INVENTION

The integrated decimation filter of the present invention comprises, in cascade, a prefilter, a decimator stage, and an equalizer, with the characteristics of said equalizer being adapted to take account of the effect of the decimation to which the signal is subjected, and with multiplication being performed by the equalizer, only.

In the integrated decimation filter of the invention, the equalizer receives a signal at a sampling rate which is reduced by the decimator. It may therefore be of a lower order than would be required for processing a signal at the higher sampling rate of the input signal, thereby obtaining savings by reducing the number of multiplications that need to be performed, while simultaneously increasing the amount of time available for performing each multiplication by virtue of the reduced sampling rate, thereby either increasing the maximum sampling rate which can be used for the input signal, or else reducing the means required for performing the multiplications.

BRIEF DESCRIPTION OF THE DRAWING

An embodiment of the invention is described by way of example with reference to the accompanying drawing, in which.

MORE DETAILED DESCRIPTION

Figure 1:
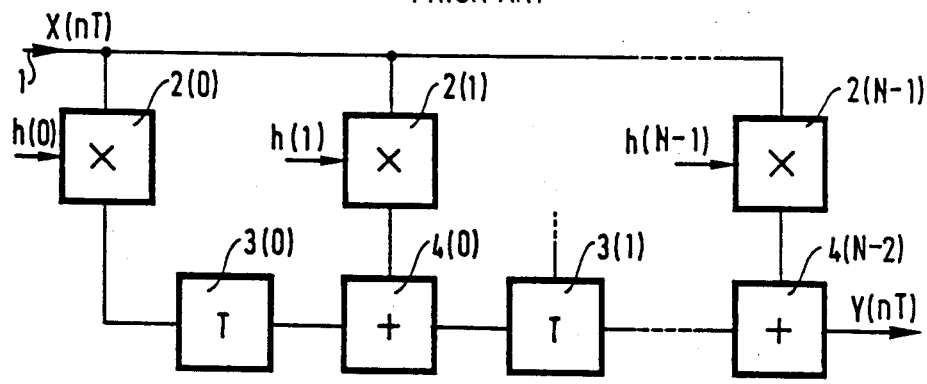
FIG. 1 is a block diagram of an FIR filter.

FIG. 1 shows a generalized block diagram of an FIR filter. A digital input filter sampled at a high rate X(nT) is applied to the input 1 of such a filter. This signal is applied to N multipliers 2(0) to 2(N−1) each of which receives a coefficient h(0) to h(N−1) specific thereto. The product of a sample of the signal X(nT) and the coefficient h(0) delivered by the multiplier 2(0) is delayed by a sampling period by a delay element 3(0) prior to being summed in an adder 4(0) with the product of the following sample of the signal X(nT) multiplied by the coefficient h(1) as delivered by the multiplier 2(1). The resulting sum is delayed, in turn, by one sampling period by delay element 3(1), prior to being added to the product provided by the next following multiplier, and so on, up to adder 4(N−2), which provides a filtered digital output signal Y(nT).

The coefficients h(0) to h(N−1) are numbers encoded on a plurality of bits. The multiplication operations are therefore relatively lengthy. Since the time they take cannot exceed one sampling period, it is the means used for performing the multiplications which define the maximum sampling rate which can be used in the input signal, or alternatively, if the sampling rate is fixed, then said rate determines the means that must be used for performing the multiplications. In some cases, such a constraint can lead to conflicts which cannot be solved in practice.

Figure 2:
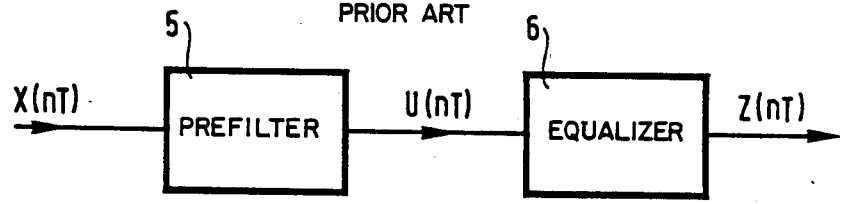
FIG. 2 shows a filter structure comprising a prefilter and an equalizer.

FIG. 2 shows a structure receiving the signal X(nT) and comprising a cascade connection of a prefilter 5 providing a signal U(nT), and an equalizer 6 providing a signal Z(nT). Such a structure may be equivalent to the filter of FIG. 1 with the signal Z(nT) being substantially identical to the signal Y(nT). It is discussed in the article "A new approach to FIR digital filters with fewer multipliers and reduced sensitivity" by J. W. Adams and A. N. Willson, published in IEE Transactions on Circuits and Systems, Vol. CAS-30, pp. 277-283, May 1983. It has the advantage of the prefilter being an FIR filter whose coefficients are such (0, −1, 1, ...) that the filter does not actually perform multiplication, thereby removing the above-mentioned constraint with respect to the prefilter, while the equalizer is an FIR filter having a small number of coefficients, such that although the constraint in question does apply thereto, it concerns only a small number of multipliers which reduces costs overall. It should nevertheless be underlined that this structure continues to be subject to the above-described limitation on the maximum admissible sampling rate, by virtue of the fact that it does include some multipliers.

Figure 3:
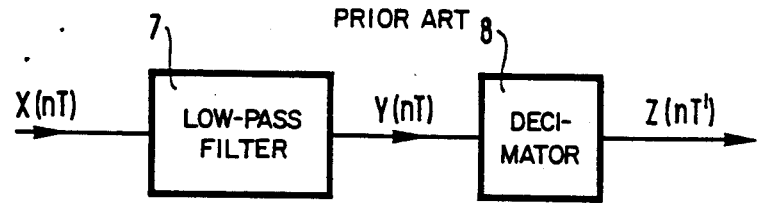
FIG. 3 is a block diagram of a conventional decimator including a low-pass input filter.

FIG. 3 shows a conventional decimator structure processing an input signal X(nT) and comprising a cascade connection of a low-pass filter 7, which may be constituted by the filter shown in FIG. 2, delivering a signal Y(nT) followed by a decimation stage 8 providing a signal Z(nT') which is the same as the signal Y(nT) except insofar as only one sample out of R has been retained where R is the ratio between the period T' and T.

In this decimator, the maximum admissible sampling rate is still limited by virtue of the presence of multipliers regardless of whether the filter 7 is implemented in the form shown in FIG. 2 or in the form shown in FIG. 1.

Further, if this conventional decimator is to be used for filtering an input signal, prior to decimation, its filter coefficients need to be modified accordingly, and further coefficients generally need to be added, thereby worsening the constraint under consideration.

Figure 4:
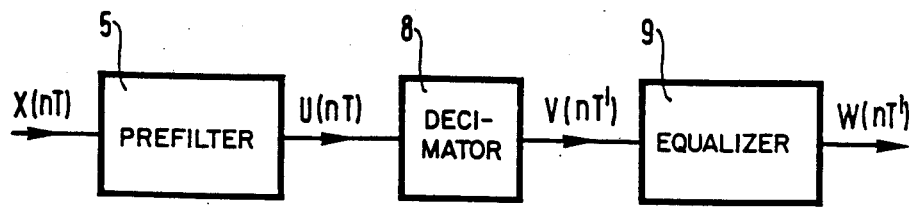
FIG. 4 is a block diagram of an integrated decimation filter in accordance with the present invention.

The present invention proposes means for getting substantially away from this constraint. This solution is illustrated by FIG. 4 which shows a filter including an integrated decimator and in accordance with the invention. This filter comprises a prefilter 5 as shown in FIG. 2, receiving the signal X(nT) and providing the signal U(nT) and, like the decimator of FIG. 3, a decimation stage 8 which provides a signal V(nT') whose period is reduced by the ratio R. This decimator stage is followed by an equalizer 9 which performs the same function from a signal processing point of view on the signal V(nT') as the FIG. 2 equalizer 6 performs on the signal U(nT). The signal W(nT') provided by this equalizer may be caused to be substantially equal to the signal Z(nT') of FIG. 2 by adopting appropriate coefficients for the filter 9. It is well known in the art how to calculate such coefficients, taking account of the lower sampling rate. It should nevertheless be emphasized that, compared with the FIG. 2 structure, this equalizer operates at a sampling rate which has been divided by R, such that the time available for the multiplication operations for a given input signal is multiplied by R, or else making it possible to increase the input sampling rate accordingly. In addition, analysis shows that in this case the equalizer may be of a lower order, which means that it may have a smaller number of multipliers.

By adopting a filter structure including prefiltering for processing signals at the high sampling rate of the input signal, but without using any multipliers, followed by equalizer processing at a lower sampling rate after decimation, the present invention makes it possible to avoid both the constraints relating to the sampling rate of the input signal and also to achieve a substantial saving in the circuits of the equalizer.

I claim:

1. A digital filter with integrated decimation for shaping an oversampled digital signal sampled at a first sampling rate, and for performing a decimation to provide a processed digital signal at a second sampling rate lower than said first sampling rate, the filter comprising:

a prefilter responsive to the oversampled digital signal for providing a first prefiltered output signal at the first sampling rate, the prefilter being implemented in the form of a first finite impulse response filter having coefficients selected only from the group consisting of 0, −1, +1, whereby only logical operations and not multiplication by a multi-digit number need be performed at the first sampling rate, a decimator responsive to the prefiltered output signal for producing a prefiltered and decimated output signal at the second sampling rate, and an equalizer responsive to the prefiltered and decimated output signal for providing the processed digital signal, the equalizer being implemented in the form of a second finite impulse filter having at least one coefficient not included in the group consisting of 0, −1, and +1, whereby all multiplication by a multi-digit number is performed only within the equalizer.

* * * * *